(12) United States Patent
Miyano et al.

(10) Patent No.: US 11,429,031 B2
(45) Date of Patent: Aug. 30, 2022

(54) EXPOSURE APPARATUS, EXPOSURE METHOD, AND METHOD OF MANUFACTURING ARTICLE

(71) Applicant: CANON KABUSHIKI KAISHA, Tokyo (JP)

(72) Inventors: Kouki Miyano, Utsunomiya (JP); Ryo Koizumi, Saitama (JP); Jun Moizumi, Utsunomiya (JP); Koji Mikami, Nikko (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 12 days.

(21) Appl. No.: 16/900,209

(22) Filed: Jun. 12, 2020

(65) Prior Publication Data
US 2020/0409276 A1  Dec. 31, 2020

(30) Foreign Application Priority Data

Jun. 25, 2019  (JP) ............................. JP2019-117714
Apr. 7, 2020  (JP) ............................. JP2020-068731

(51) Int. Cl.
*G03F 7/20*  (2006.01)
(52) U.S. Cl.
CPC .......... *G03F 7/70891* (2013.01); *G03F 7/706* (2013.01)
(58) Field of Classification Search
CPC ... G03F 7/706; G03F 7/70891; G03F 7/70525
See application file for complete search history.

(56) References Cited

U.S. PATENT DOCUMENTS

| | | | | |
|---|---|---|---|---|
| 5,805,273 | A  * | 9/1998 | Unno .................. | G03F 7/70266 355/53 |
| 9,442,381 | B2 * | 9/2016 | Conradi .............. | G03F 7/70516 |
| 2005/0140947 | A1* | 6/2005 | Miyajima ........... | G03F 7/70891 355/30 |
| 2013/0141707 | A1* | 6/2013 | Baer ................... | G03F 7/70316 359/838 |
| 2014/0327892 | A1* | 11/2014 | Walter ............... | G02B 27/0068 355/30 |
| 2021/0088781 | A1* | 3/2021 | Yamamoto ......... | G02B 27/0043 |

FOREIGN PATENT DOCUMENTS

| | | |
|---|---|---|
| JP | 5266641 B2 | 8/2013 |
| WO | 2006025408 A1 | 3/2006 |

* cited by examiner

*Primary Examiner* — Deoram Persaud
(74) *Attorney, Agent, or Firm* — Rossi, Kimms & McDowell LLP

(57) ABSTRACT

An exposure apparatus includes a first temperature controller for controlling a temperature distribution on an optical element of a projection optical system, and a second temperature controller for controlling a temperature distribution on an optical element of the projection optical system, wherein in a first period in which the exposure operation is executed, at least one of the first temperature controller and the second temperature controller operates to reduce a change in an aberration of the projection optical system due to the exposure operation being executed, and in a second period which follows the first period and in which the exposure operation is not executed, at least one of the first temperature controller and the second temperature controller operates to reduce a change in an aberration due to the exposure operation not being executed.

32 Claims, 9 Drawing Sheets

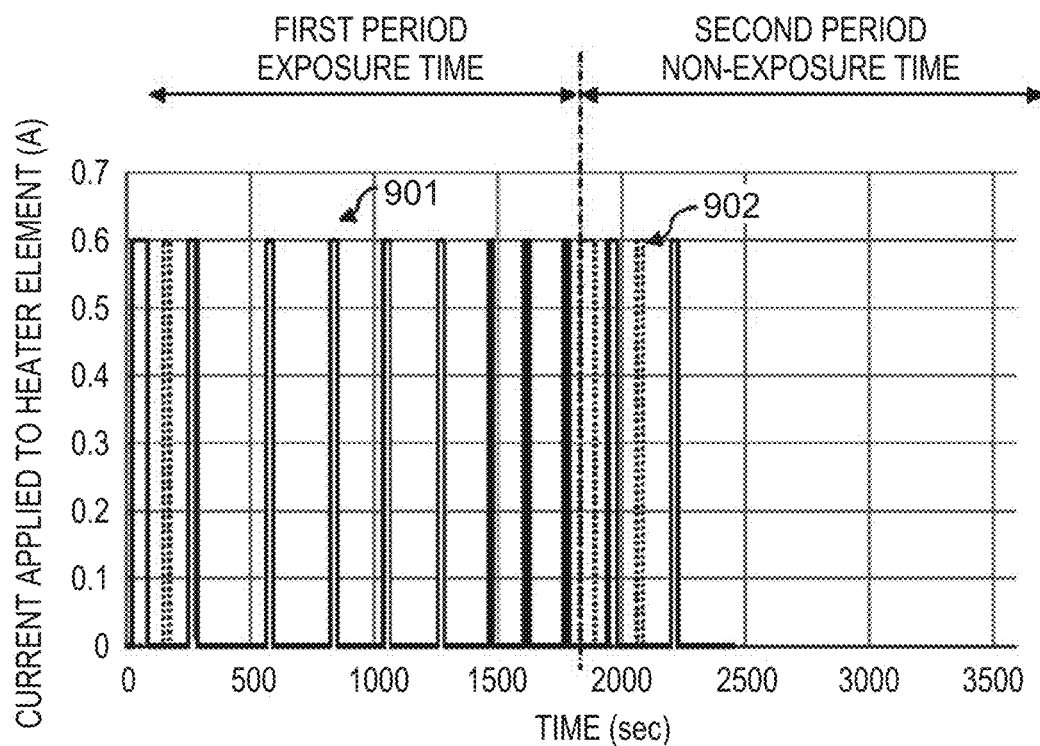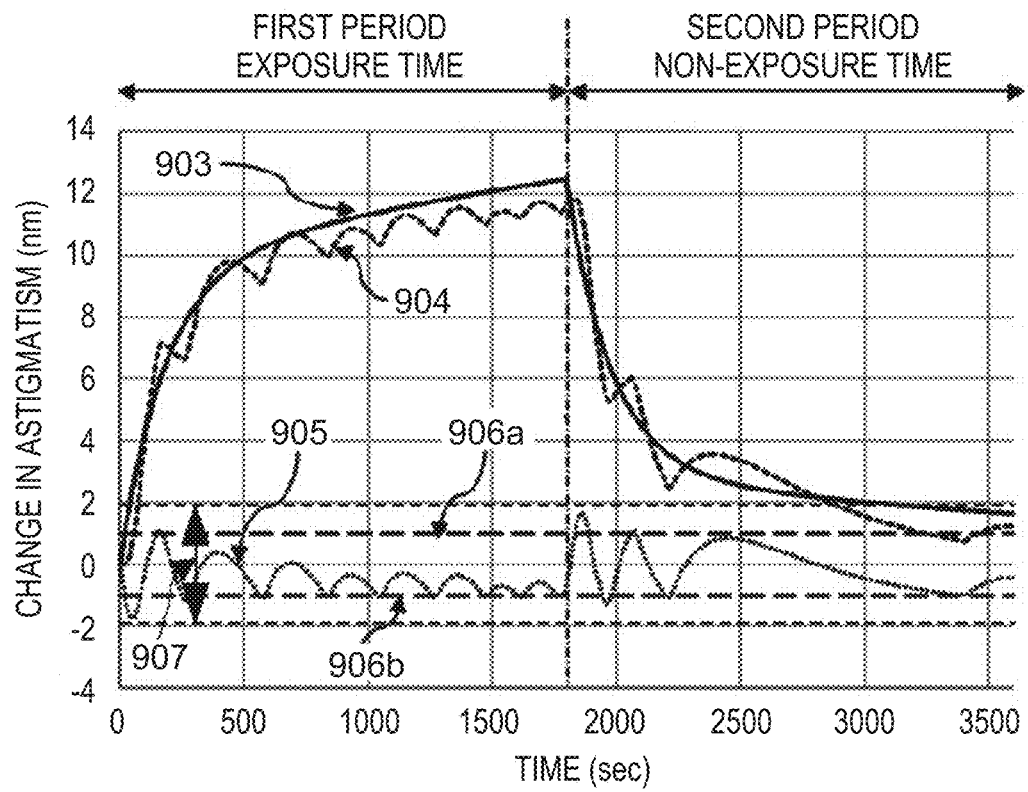

EXPOSURE APPARATUS, EXPOSURE METHOD, AND METHOD OF MANUFACTURING ARTICLE

BACKGROUND OF THE INVENTION

Field of the Invention

The present invention relates to an exposure apparatus, an exposure method, and a method of manufacturing an article.

Description of the Related Art

In the manufacturing of an article such as a semiconductor device or the like, an exposure apparatus that illuminates an original (a reticle or a mask) by an illumination optical system, projects a pattern of an original onto a substrate via a projection optical system, and exposes the substrate. Since the imaging characteristic of a projection optical system changes depending on an exposure light irradiation operation, the imaging characteristic can be corrected in the exposure apparatus by controlling the posture and position of an optical element. An aberration component that can be corrected by controlling the posture and the position of an optical element is limited, and a non-rotation symmetric imaging characteristic such as astigmatism cannot be corrected. Japanese Patent No. 5266641 discloses that the optical characteristic of a projection optical system is adjusted by changing the temperature distribution on an optical member, which is arranged near a pupil plane of the projection optical system, by using an adjustment mechanism to adjust the temperature of the optical member.

Japanese Patent No. 5266641 merely discloses that the imaging characteristic of a projection optical system will be adjusted by an adjustment mechanism during a period in which an exposure operation is executed, and does not disclose that the adjustment of the imaging characteristic will be performed by the adjustment mechanism in a period in which an exposure operation is not executed. If adjustment by the adjustment mechanism is stopped in a period in which the exposure operation is not performed, there is a possibility that a large correction residual error will be generated when the exposure operation is restarted. This is because the temporal change in the imaging characteristic after the end of the exposure operation is different from the temporal change in the imaging characteristic after the end of adjustment by the adjustment mechanism.

SUMMARY OF THE INVENTION

The present invention provides a technique advantageous in correcting, with high accuracy, an aberration of a projection optical system even in a case in which an exposure operation is restarted after the exposure operation has been stopped.

One of aspects of the present provides an exposure apparatus that performs an exposure operation to expose a substrate via a projection optical system. The apparatus comprising: a first temperature controller configured to control a temperature distribution on an optical element of the projection optical system; and a second temperature controller configured to control a temperature distribution on an optical element of the projection optical system. In a first period in which the exposure operation is executed, at least one of the first temperature controller and the second temperature controller operates to reduce a change in an aberration of the projection optical system due to the exposure operation being executed, and in a second period which follows the first period and in which the exposure operation is not executed, at least one of the first temperature controller and the second temperature controller operates to reduce a change in an aberration due to the exposure operation not being executed.

Further features of the present invention will become apparent from the following description of exemplary embodiments with reference to the attached drawings.

BRIEF DESCRIPTION OF THE DRAWINGS

FIGS. 9A and 9B are graphs showing the correction of an aberration in a projection optical system of an exposure apparatus according to the third embodiment;

DESCRIPTION OF THE EMBODIMENTS

Figure 1:
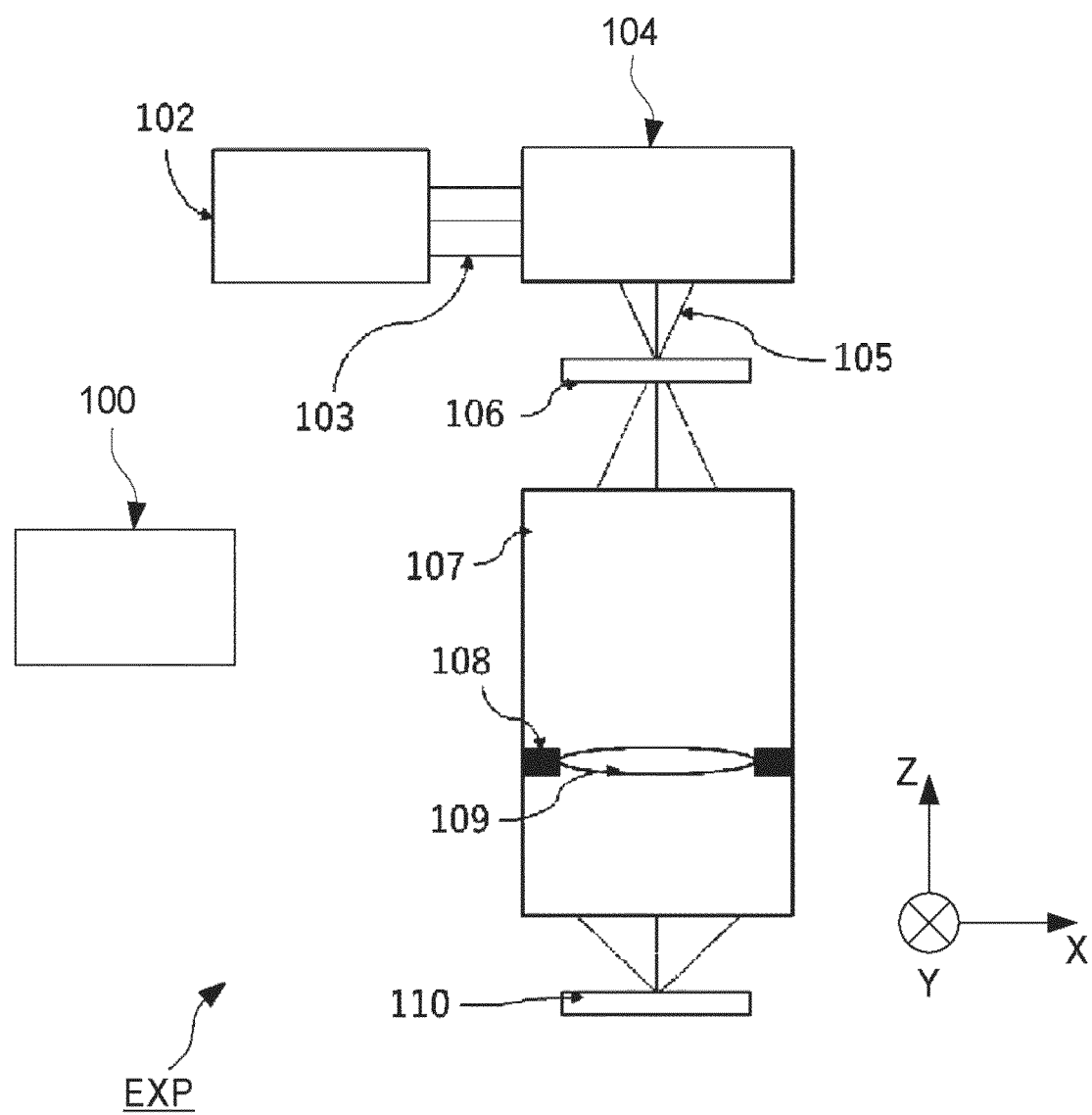
FIG. 1 is a view schematically showing the arrangement of an exposure apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1 schematically shows the arrangement of an exposure apparatus EXP according to the first embodiment. The exposure apparatus EXP schematically performs an exposure operation of exposing a substrate 110 via a projection optical system 107. In the specification and the drawings, directions are indicated based on an XYZ coordinate system in which a plane parallel to a surface on which the substrate 110 is arranged is set as an X-Y plane in FIG. 1. The exposure apparatus EXP includes a light source 102, an illumination optical system 104, the projection optical system 107, and a controller 100. In an exposure operation, the illumination optical system 104 illuminates an original 106 with light (exposure light) from the light source 102, and the pattern of the original 106 is projected onto the substrate 110 by the projection optical system 107 to expose the substrate 110. The exposure apparatus EXP may be formed as an exposure apparatus that exposes the substrate 110 in a state in which the original 106 and the substrate 110 are stopped still or as an exposure apparatus that exposes the substrate 110 while scanning the original 106 and the substrate 110. In general, the substrate 110 includes a plurality of shot regions, and an exposure operation is performed on each shot region.

The light source 102 can include, for example, an excimer laser, but can also include another light-emitting device. The excimer laser can generate, for example, light having a wavelength of 248 nm or 193 nm, but light of another wavelength can also be generated. The projection optical system 107 can include an optical element 109 and a temperature adjustment unit 108 that adjusts the temperature distribution on the optical element 109. The temperature adjustment unit 108 can reduce the change in the optical characteristic of the projection optical system 107 by applying thermal energy to the optical element 109 to change the refractive index distribution and/or the surface shape of the optical element 109. The thermal energy applied to the optical element 109 by the temperature adjustment unit 108 can include positive energy and negative energy. Application of positive energy to the optical element 109 represents heating of the optical element 109, and application of negative energy to the optical element 109 represents cooling of the optical element 109.

The temperature adjustment unit 108 may be arranged to be tightly adhered to the optical element 109, and the thermal energy transmission between the temperature adjustment unit 108 and the optical element 109 will be efficient in such a case. Alternatively, the temperature adjustment unit 108 may be arranged spaced apart from the optical element 109, and this arrangement is advantageous in the point that a mechanical force will not be applied to the optical element 109 by the temperature adjustment unit 108, and in the point that the temperature adjustment unit 108 will not damage the optical element 109 by scratching or the like.

It is preferable to arrange the temperature adjustment unit 108 outside the effective diameter (optical path) of the optical element 109 so the temperature adjustment unit 108 will not block the light irradiation to the substrate 110. For example, the temperature adjustment unit 108 can be arranged on the outer edge portion of a lens serving as the optical element 109, the front surface of the lens, or the back surface of the lens. Alternatively, the temperature adjustment unit 108 may be arranged inside the effective diameter in a range that will not influence the optical performance of the projection optical system 107. As an example of such an arrangement, for example, a thin heating wire may be arranged in the effective diameter of the optical element or a heat transmitting element which has a high light transmittance may be arranged in the effective diameter of the optical element.

Although it is preferable to arrange the optical element 109 at or near a pupil plane of the projection optical system 107 in a case in which the temperature adjustment unit 108 is to be arranged on the outer periphery of the optical element 109, the temperature adjustment unit 108 may also be arranged spaced apart from the pupil plane of the projection optical system 107. The temperature adjustment unit 108 can include a plurality of temperature controllers including a first temperature controller for controlling the temperature distribution on the optical element 109 of the projection optical system 107 and a second temperature controller for controlling the temperature distribution on the optical element 109 of the projection optical system 107. The first temperature controller can operate to reduce, in a first period in which an exposure operation is executed, the change in the optical characteristic of the projection optical system 107 due to the execution of the exposure operation. The second temperature controller can operate to reduce, in a second period following the first period and in which an exposure operation is not executed, the change in the optical characteristic of the projection optical system 107 due to the absence of execution of the exposure operation. Alternatively, in the first period in which the exposure operation is executed, at least one of the first temperature controller and the second temperature controller can operate to reduce the change in the optical characteristic of the projection optical system 107 due to the execution of the exposure operation. In addition, in the second period following the first period and in which the exposure operation is not executed, at least one of the first temperature controller and the second temperature controller can operate to reduce the change in the optical characteristic of the projection optical system 107 due to the absence of the execution of the exposure operation. In the plurality of temperature controllers (the first temperature controller and the second temperature controller), the amount of thermal energy applied to the optical element 109 and the continuation time of the application are controlled individually for each temperature controller, and the temperature distribution on the optical element 109 can be controlled as a result. The controller 100 can control the plurality of temperature controllers (the first temperature controller and the second temperature controller). The optical element 109 whose temperature distribution is controlled by the first temperature controller may be the same as or different from the optical element 109 whose temperature distribution is controlled by the second temperature controller.

The temperature adjustment unit 108 can change, in a period in which the exposure operation is executed and in a period in which the exposure operation is not executed, the thermal energy applied to the optical element 109 can be changed in synchronization with the optical characteristic of the projection optical system 107 which changes as time passes. In this case, the information required for the control operation by the temperature adjustment unit 108 can be generated based on a result obtained by measuring the optical characteristic of the projection optical system 107 on the imaging plane (the surface on which the substrate 110 is to be arranged) of the projection optical system 107. Alternatively, the information required for the control operation by the temperature adjustment unit 108 may be determined in advance by a measurement operation or the like. The operation performed by the temperature adjustment unit 108 to control the application of thermal energy to the optical element 109 can be implemented by, for example, in a case in which the temperature adjustment unit 108 includes a heating wire, controlling a current value applied to the heating wire. Alternatively, the operation performed by the temperature adjustment unit 108 to control the application of thermal energy to the optical element 109 may be implemented by, for example, a physical distance or a thermal distance between the optical element 109 and the temperature adjustment unit 108.

The controller 100 can control the light source 102, the illumination optical system 104, the projection optical system 107, and the temperature adjustment unit 108. More specifically, the controller 100 can be formed not only to control the exposure operation, but also to control the temperature adjustment unit 108 in the first period and the second period. The controller 100 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer embedded with a program, or a combination of all or some of these components.

Figure 2A:
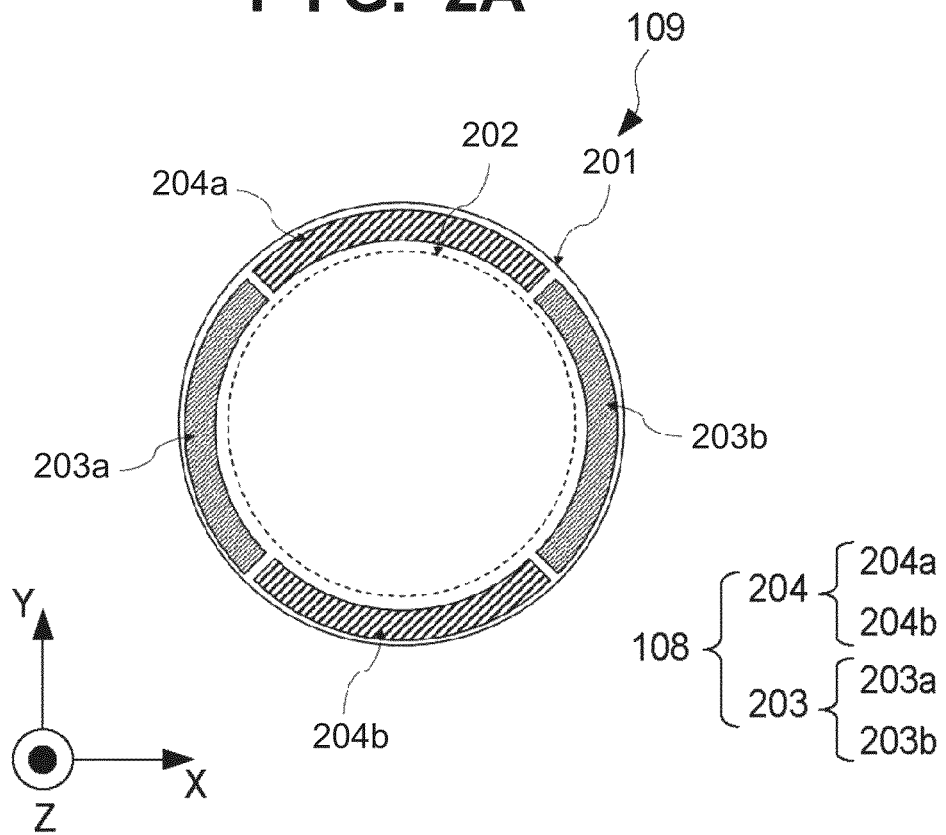
FIGS. 2A and 2B are views showing an example of the arrangement of an optical element and a temperature adjustment unit of the exposure apparatus according to the first embodiment.
Figure 2B:
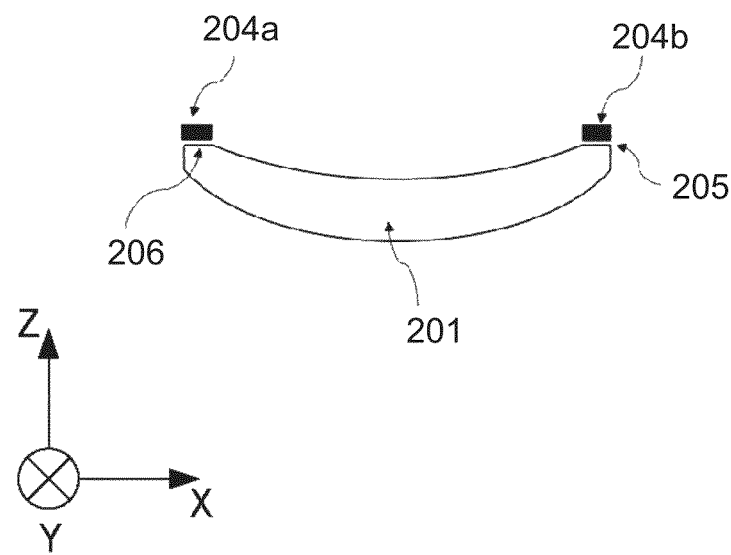

FIGS. 2A and 2B each show an example of the arrangement of the optical element 109 and the temperature adjustment unit 108 in the exposure apparatus EXP according to the first embodiment. The optical element 109 can include a lens 201. The temperature adjustment unit 108 can include a first temperature controller 204 formed by heater elements 204a and 204b and a second temperature controller 203 formed by heater elements 203a and 203b. Each of the heater elements 204a, 204b, 203a, and 203b can have an arc shape corresponding to an arc which is ¼ of the circumference of the lens 201. Each of the heater elements 204a, 204b, 203a, and 203b can be formed by a flexible cable which includes a heating wire, generate heat when a current is applied to the heating wire, and form a temperature distribution on the lens 201.

For example, each of the heater elements 204a, 204b, 203a, and 203b can be arranged spaced apart from the planar portion of the lens 201 by 10 to 100 µm. The heat generated by each of the heater elements 204a, 204b, 203a, and 203b can be transmitted to the lens 201 via a medium 205 between the lens 201 and the heater elements 204a, 204b, 203a, and 203b. The medium 205 can be, for example, a gas such as air, nitrogen, or the like. The heater elements 204a, 204b, 203a, and 203b need not directly face the lens 201 via the medium 205. For example, each of the heater elements 204a, 204b, 203a, and 203b may have structure that sandwiches the heating wire by metal elements with a high thermal conductance.

In the example of FIG. 2B, the heater elements 204a, 204b, 203a, and 203b are arranged on the planar portion (on the side of the illumination optical system 104) of the lens 201. However, the heater elements 204a, 204b, 203a, and 203b may be arranged below (on the side of the substrate 110) the lens 201 or on the outer edge portion of the lens 201. The lens 201 can have a heated surface 206 which is heated by the heater elements 204a, 204b, 203a, and 203b. The heated surface 206 may be flat or curved. The heated surface 206 can be, for example, a roughened surface (a surface in the manner of frosted glass).

Figure 3A:
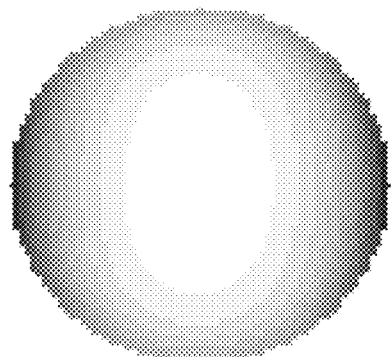
FIGS. 3A and 3B are views exemplifying the temperature distribution on a lens heated by the temperature adjustment unit.
Figure 3B:
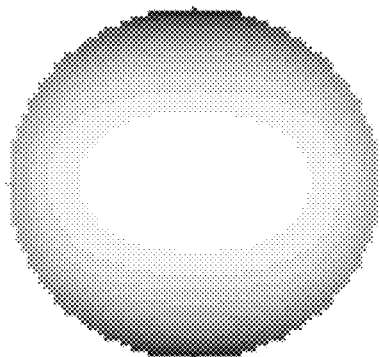

FIG. 3A exemplifies the temperature distribution on the lens 201 that has been heated by the first temperature controller 204. At this time, astigmatism is generated on the surface of the substrate 110 in the positive direction. FIG. 3B exemplifies the temperature distribution on the lens 201 heated by the second temperature controller 203. The temperature distribution of FIG. 3B is a temperature distribution that has the opposite phase of the temperature distribution of FIG. 3A. The temperature distribution of FIG. 3B generates astigmatism on the surface of the substrate 110 in the negative direction. In this manner, positive and negative astigmatisms can be generated by heating of the lens 201 by the first temperature controller 204 and the second temperature controller 203. Compared to an arrangement in which the positive astigmatism and the negative astigmatism are generated by a combination of heating and cooling by using an element such as a Peltier element, this kind of arrangement is advantageous in that the arrangement of the temperature adjustment unit 108 can be simplified.

Figure 4:
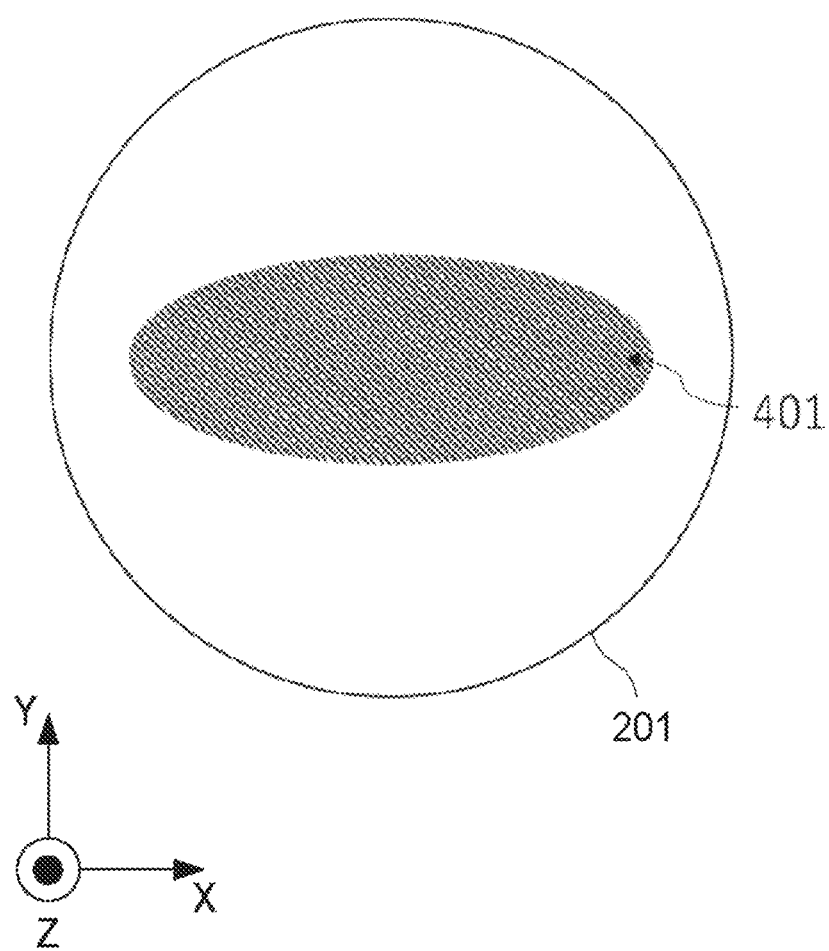
FIG. 4 is a view exemplifying the distribution of a light beam that passes through a lens of a projection optical system of a scanning exposure apparatus.

If the exposure apparatus EXP is applied here to a scanning exposure apparatus that scans the original 106 and the substrate 110 with respect to a long slit-shaped light beam (exposure light) in the X direction, the intensity distribution of the light beam that passes through the projection optical system 107 at the time of the exposure operation can be as that shown by a hatched portion 401 of FIG. 4. In this case, the temperature distribution on the lens 201 (the optical element 109) generated by the absorption of the light beam will differ in the X direction and the Y direction. This can cause a large amount of astigmatism to be generated in the projection optical system 107. Hence, a temperature distribution can be applied to the lens 201 by the first temperature controller 204 so as to reduce this amount of astigmatism. The astigmatism of the projection optical system 107 generated by the first temperature controller 204 and the astigmatism of the projection optical system 107 generated when the lens 201 absorbs a light beam have opposite signs. Therefore, the astigmatism of the projection optical system 107 generated by the absorption of the light beam by the lens 201 can be reduced by the astigmatism of the projection optical system 107 which is generated by the first temperature controller 204. Note that the term "astigmatism" represents the astigmatism of the projection optical system 107 hereinafter unless otherwise mentioned in particular.

The change (temporal change characteristic) in the astigmatism generated by the first temperature controller 204 may differ from the change (temporal change characteristic) in the astigmatism generated by the absorption of the light beam by the lens 201. In this case, the current supplied to the heating wire of the first temperature controller 204 is controlled to control the change in the astigmatism by the first temperature controller 204 so that the astigmatism generated by the absorption of the light beam by the lens 201 can be canceled with higher accuracy.

Figure 5:
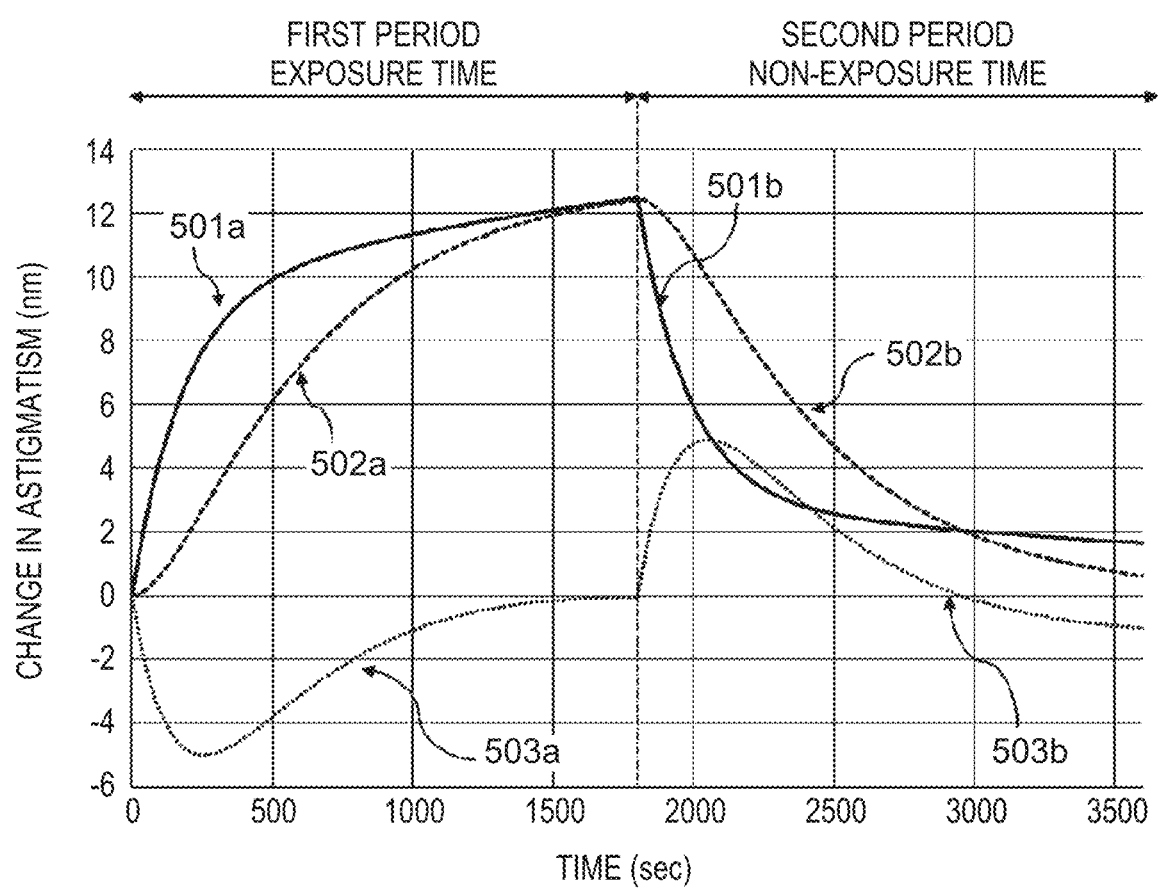
FIG. 5 is a graph exemplifying the temporal characteristic of the change in astigmatism.

FIG. 5 exemplifies the temporal characteristic of the change in astigmatism. In FIG. 5, "exposure time" indicates the first period which includes the exposure operation, and "non-exposure time" indicates the second period which is a period following the first period and in which the exposure operation is not executed. In the first example, the first period can be a period from the start of the first exposure operation on a substrate until the end of the final exposure operation on the substrate. The second period can be a period that starts from the end of the final exposure operation on the substrate. The second period is, for example, a period from the end of the final exposure operation on the substrate until the start of the first exposure operation on the next substrate. Here, the next substrate may be a substrate belonging to the same lot as the preceding substrate or a substrate which is the first substrate of the next lot. After a predetermined time elapsed from the end of the execution of the final exposure operation, the second period can be ended, and the operation of the temperature adjustment unit 108 can be stopped. The first example is suitable for a case in which the change in the aberration between a shot region in a substrate and the next shot region of the substrate can be ignored. In the second example, the first period is a period in which the exposure operation is executed on each shot region of a substrate, and the second period can include a period from the end of the exposure operation on one shot region of the substrate until the start of the exposure operation on the next shot region of the substrate. The second example is suitable for a case in which the change in the aberration between one shot region of a given substrate and the next shot region of the given substrate needs to be considered. In the third example, the first period can be a period from the start of the first exposure operation on the first substrate of the first lot until the final exposure operation on the final substrate of the first lot. The second period can be a period from the end of the final exposure operation on the final substrate of the first lot until the start of the first exposure operation on the first substrate of the second lot following the first lot. Although the first, second, and third examples are different from each other in how roughly the exposure operation is set, but these examples can be understood as having a common idea.

In FIG. 5, a curve 501a exemplifies the change in the astigmatism generated by the lens 201 absorbing the light beam in the first period. As an ideal method of reducing or canceling the astigmatism generated by the absorption of the light beam by the lens 201, the first temperature controller 204 can be used to heat the lens 201 to generate astigmatism that will change in a curve in which the curve 501a has an opposite sign. However, as exemplified by a curve 502a, if the first temperature controller 204 continuously heats the lens 201 at a predetermined temperature, the astigmatism generated by this heating operation tends to change by a slower time constant than that of the curve 501a. Hence, the astigmatism shown by the curve 501a cannot be completely corrected (canceled), and a correction residual error as shown by a curve 503a can be generated.

A similar phenomenon can also occur in the second period. Since the exposure operation is not executed in the second period, the light beam does not pass through the lens 201. Hence, although the temperature change of the lens 201 due to the absorption of the light beam will not occur in the second period, the lens 201 is deformed by heat dissipation from the lens 201, and the astigmatism is temporally changed as a result. A curve 501b exemplifies the change in the astigmatism generated when the heat, which was generated due to the absorption of the light beam, is radiated (dissipates) from the lens 201. The time constant of the curve 501b can be the same as the time constant of the curve 501a.

When the heating of the lens 201 by the first temperature controller 204 is stopped simultaneously with the shift from the first period to the second period, the heat applied to the lens 201 by the first temperature controller 204 in the first period is radiated (dissipates) from the lens 201 in the second period. Accordingly, the astigmatism can change in the manner of a curve 502b. A temporal change characteristic difference, as that present between the curve 501a and the curve 502a, is present between the curve 501b and the curve 502b. Hence, in also the second period, a correction residual error can be generated as shown by a curve 503b.

In general, the curves 501a, 501b, 502a, and 502b can be expressed in the manner of a first-order lag system as expressed by a generated aberration amount $\varphi(t)$ at time t $$\varphi(t) = A^2G - \{A^2G - \varphi(t-\Delta t)\}\exp\left(-\frac{\Delta t}{K}\right) \quad (1)$$

where A is an amount related to an amount of heat applied from time t, G is a coefficient related to the generated aberration amount, and K is a coefficient related to a time constant of the generated aberration amount. Alternatively, the curves 501a, 501b, 502a, and 502b can be expressed in the manner of a second-order lag system as expressed by a generated aberration amount $\varphi(t)$ at time t $$\varphi(t) = \varphi_1(t) + \varphi_2(t) \quad (2)$$

$$\varphi_1(t) = \varphi_1(t-\Delta t)\exp\left(-\frac{\Delta t}{\tau_1 + \tau_2}\right) + A^2G\frac{\tau_1 + \tau_2}{\tau_1}\left\{1 - \exp\left(-\frac{\Delta t}{\tau_1 + \tau_2}\right)\right\}$$

$$\varphi_2(t) = \varphi_2(t-\Delta t)\exp\left(-\frac{\Delta t}{\tau_2}\right) + A^2G\frac{\tau_1}{\tau_1}\left\{1 - \exp\left(-\frac{\Delta t}{\tau_2}\right)\right\}$$

where $\tau_1$ and $\tau_2$ are coefficients related to a time constant expressing a second-order lag, A is an amount related to an amount of heat applied from time t, G is a coefficient related to the generated aberration amount, and K is a coefficient related to a time constant of the generated aberration amount. However, these curves may be expressed in accordance with another model.

Figure 6A:
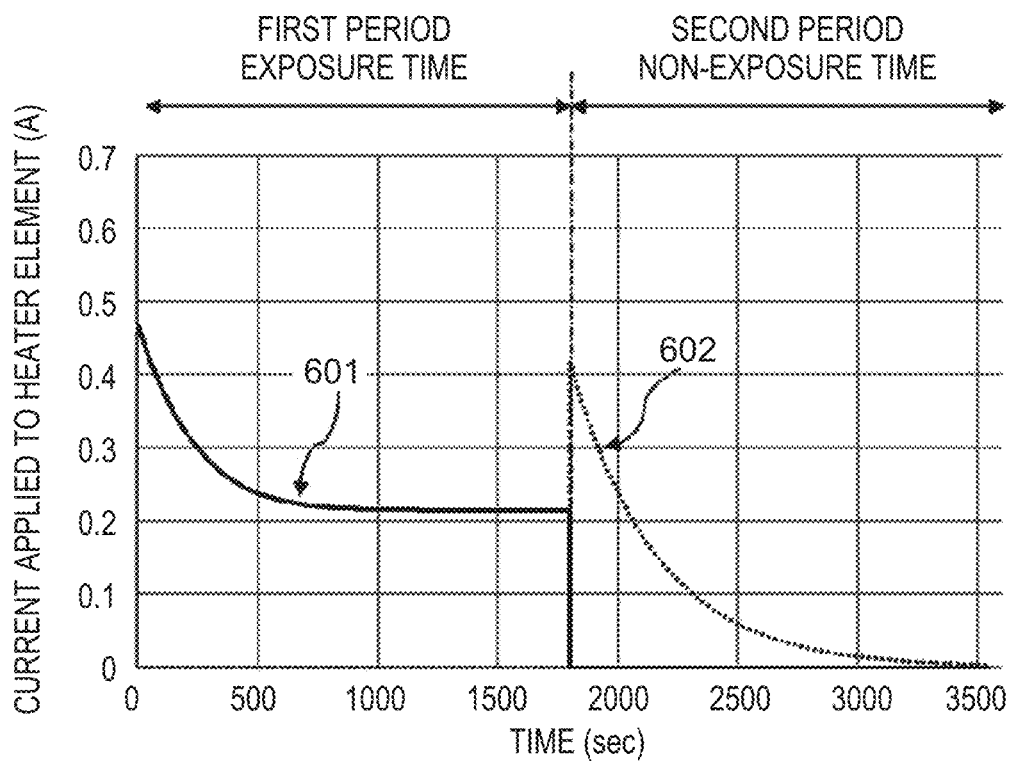
FIGS. 6A and 6B are graphs exemplifying the correction of an aberration in a projection optical system of the exposure apparatus according to the first embodiment.
Figure 6B:
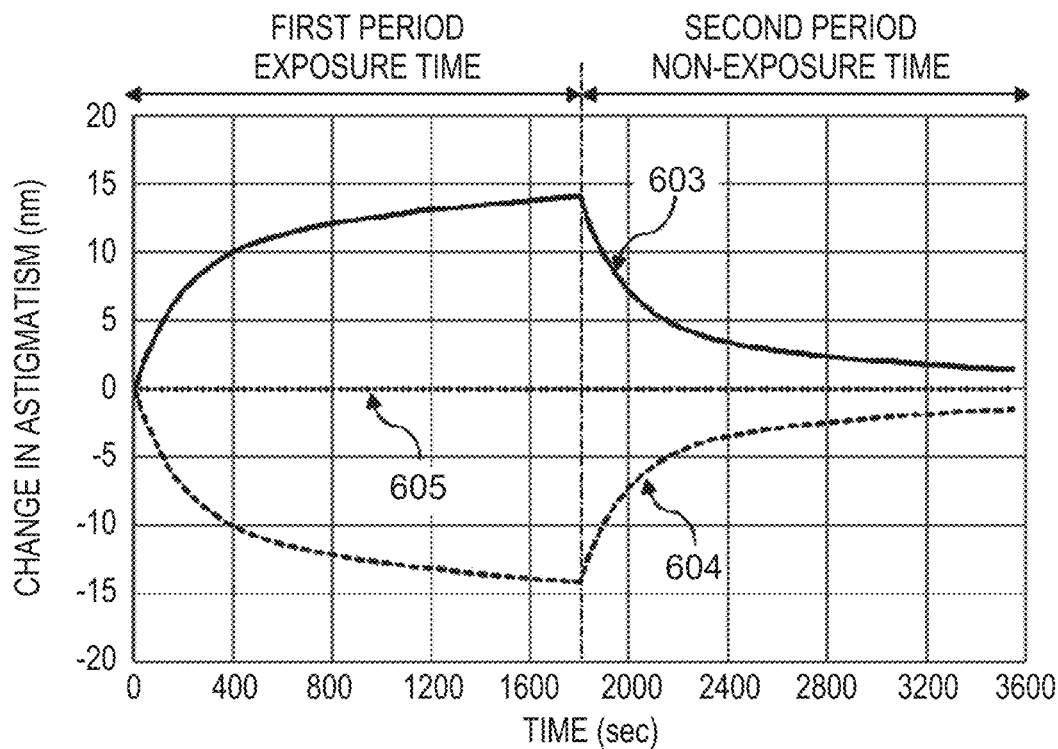

To reduce the correction residual error due to such a difference in the temporal change characteristic, the controller 100 can control the thermal energy applied to the lens 201 by the first temperature controller 204 and the second temperature controller 203. This method will be described with reference to FIGS. 6A and 6B. In this method, the first temperature controller 204 and the second temperature controller 203 can control, in accordance with a command value corresponding to the elapsed time from the start of the first period and a command value corresponding to the elapsed time from the start of the second period, respectively, the thermal energy applied to the lens 201. A current 601 to be applied to the heater elements 204a and 204b of the first temperature controller 204, and a current 602 to be applied to the heater elements 203a and 203b of the second temperature controller 203 are exemplified in FIG. 6A. The controller 100 can be arranged to supply, to the first temperature controller 204, a command value corresponding to the current 601 as a command value which is in correspondence with the elapsed time from the start of the first period. Also, the controller 100 can be arranged to supply, to the second temperature controller 203, a command value corresponding to the current 602 as a command value which is in correspondence with the elapsed time from the start of the second period. The change in astigmatism 603 generated by the absorption of a light beam is exemplified in FIG. 6B. The change in astigmatism 604 generated by heating due to the current applied to the heater elements 204a and 204b of the first temperature controller 204 and the current applied to the heater elements 203a and 203b of the second temperature controller 203 is also exemplified in FIG. 6B. In addition, the change in a correction residual error 605 is also exemplified in FIG. 6B.

In this example, in the first period, the current is applied to the heater elements 204a and 204b of the first temperature controller 204, and the current is not applied to the heater elements 203a and 203b of the second temperature controller 203. On the other hand, in the second period, the current is not applied to the heater elements 204a and 204b of the first temperature controller 204, and the current is applied to the heater elements 203a and 203b of the second temperature controller 203. For example, in the first period in which the exposure operation is executed, the controller 100 can gradually decrease, from a predetermined value, the current to be applied to the heater elements 204a and 204b of the first temperature controller 204 in accordance with the elapsed time from the start of the first period. As a result, the change in the astigmatism 604 generated by heating due to the current applied to the heater elements 204a and 204b of the first temperature controller 204 can be made to follow the change in the astigmatism 603 generated by the absorption of the light beam.

For example, in the second period in which the exposure operation is not executed, the controller 100 can stop the heating by the first temperature controller 204 and gradually decrease, from a predetermined value, the current applied to the heater elements 203a and 203b of the second temperature controller 203 in accordance with the elapsed time from the start of the second period. As a result, the change in the astigmatism 604 generated by heating due to the current applied to the heater elements 204a and 204b of the first temperature controller 204 can be made to follow the change in the astigmatism 603 generated by the absorption of the light beam. As a result, it becomes possible to reduce, in the first period in which the exposure operation is executed and in the second period in which the exposure operation is not executed, the astigmatism generated by the temperature distribution on the lens 201 to a level that is unproblematic for the exposure operation of the substrate.

In general, the temperature distribution on the lens 201 need not be made uniform by using the first temperature controller 204 and the second temperature controller 203. This is because the correction target is not the astigmatism of the lens 201, but the astigmatism of the projection optical system 107 (the overall aberration of the projection optical system 107 generated when all of the optical elements forming the projection optical system 107 absorb the light beam). Hence, to correct and reduce the overall astigmatism of the projection optical system 107, a required temperature distribution can be generated on the lens 201 by the first temperature controller 204 and the second temperature controller 203.

The profile (temporal change) of the current 601 applied to the first temperature controller 204 (204a, 204b) and the profile of the current 602 applied to the second temperature controller 203 (203a, 203b) can be determined based on an experiment for obtaining the relationship between each current value and the corresponding measured value of the astigmatism. Alternatively, each of the profile of the current 601 and the profile of the current 602 can be determined based on the temperature distribution on the heated lens 201. Alternatively, each of the profile of the current 601 and the profile of the current 602 can be based on a parameter that has been obtained in advance.

As a method for obtaining the parameter in advance, for example, there is a method of actually measuring the temporal change in the aberration of the projection optical system 107 when the lens 201 is heated by the temperature controllers 204 and 203 after the projection optical system 107 has been assembled, and determining the parameter based on the measurement result. According to this method, since the parameter can be determined by including the aberration change generated by the heat transfer and heat radiation to each optical element in the periphery of the lens 201 and the lens barrel of the projection optical system 107, the profile of each current determined highly accurately. Hence, this method is superior to a method in which the parameter is determined by measuring only the lens 201 whose temperature distribution is controlled by the first temperature controller 204 and the second temperature controller 203. Furthermore, the parameter may be determined by measuring the aberration of the projection optical system 107 after incorporating the projection optical system 107 into the exposure apparatus EXP or the parameter may be determined by updating an already determined parameter.

The determination timing and the application timing of the current value may be set at a predetermined time interval or a random time interval. The time interval is preferably set to, for example, 0.1 to 10 sec, and is further preferably set to 1 to 5 sec. Also, the current value profile may be determined in advance at the start of a lot, and the current value during the processing of the lot can be controlled in according to this profile. An aberration component other than the astigmatism may be newly generated depending on the control performed by the temperature adjustment unit 108 on the temperature distribution on the lens 201. In this case, the newly generated aberration can be reduced by a driving operation to shift and/or tilt the optical element forming the projection optical system 107, changing the wavelength of light generated by the light source 102, or the like.

Figure 7A:
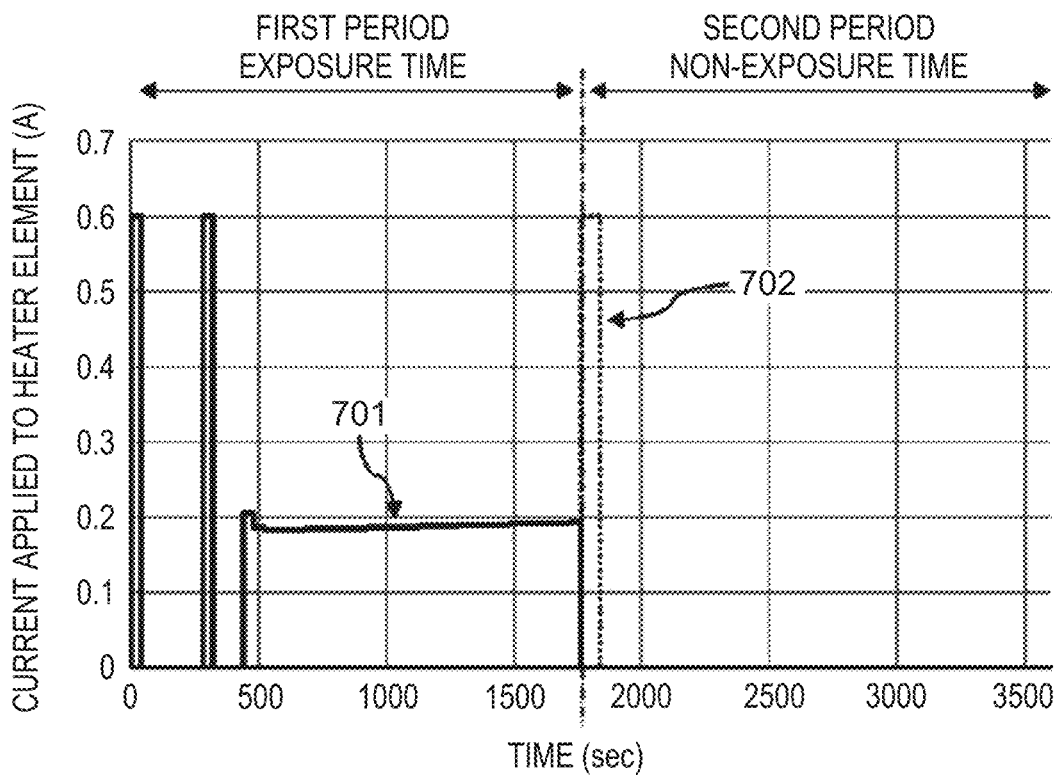
FIGS. 7A and 7B are views showing an example of the correction of the aberration in the projection optical system of the exposure apparatus according to the first embodiment.
Figure 7B:
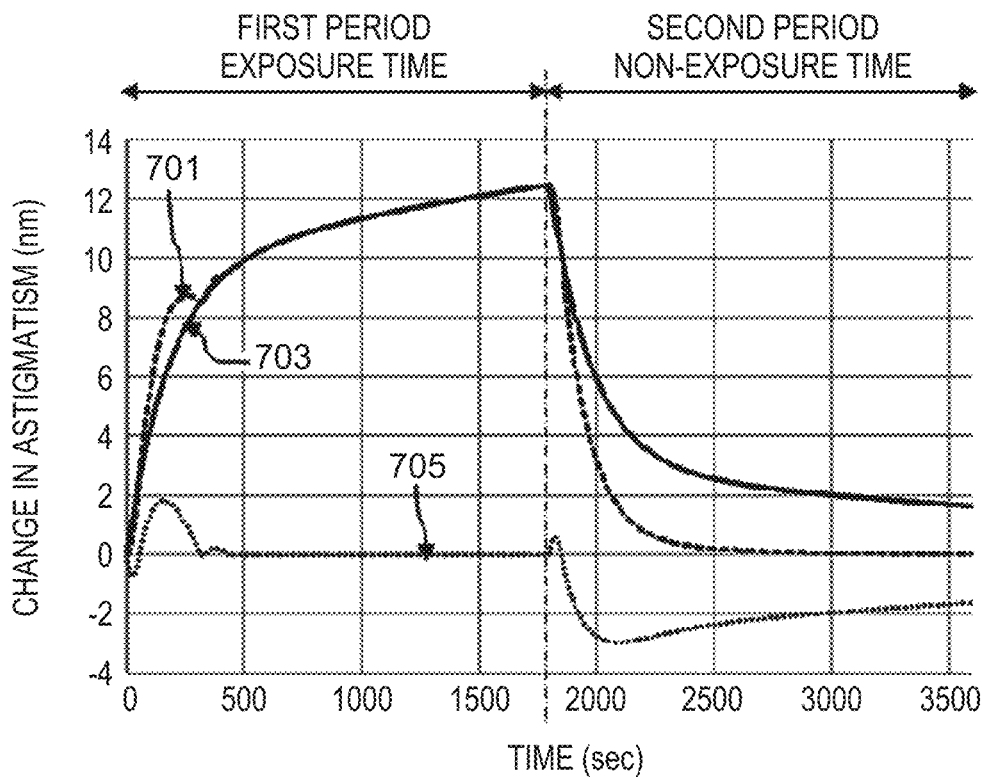

The second embodiment will be described hereinafter with reference to FIGS. 7A and 7B and FIGS. 8A and 8B. Matters not mentioned in the second embodiment can follow those of the first embodiment. FIGS. 7A and 7B are graphs shown as a comparison target of the second embodiment. A current value 701 to be applied to heater elements 204a and 204b of a first temperature controller 204 and a current value 702 to be applied to heater elements 203a and 203b of a second temperature controller 203 according to the first embodiment are exemplified in FIG. 7A. The change in astigmatism 703 generated by the absorption of a light beam is exemplified in FIG. 7B. In addition, a change in astigmatism 704 generated by the heating due to the application of the current values 701 and 702 to the heater elements 204a and 204b of the first temperature controller 204 and the heater elements 203a and 203b of the second temperature controller 203, respectively, is exemplified in FIG. 7B. Furthermore, a change in a correction residual error 705 is exemplified in FIG. 7B. Note that although the astigmatism 704 has been obtained by multiplying the actual astigmatism generated by the heating by the current values 701 and 702 by −1, this is merely for the sake of visual convenience. As exemplified in FIG. 7B, a very large correction residual error 705 is present. The size of the correction residual error 705 can depend on the difference between the astigmatism (a curve 501) generated by the absorption of the light beam and a model (for example, a first-order lag system or a second-order lag system) of the astigmatism (a curve 502) generated by the first temperature controller 204, the size of the time constant of the model, and the like. In particular, the correction residual error 705 tends to be generated when there is a strong second-order lag tendency in the astigmatism (the curve 502). This can depend on, for example, the shape of a lens 201 and the arrangement of the first temperature controller 204 and the second temperature controller 203.

Figure 8A:
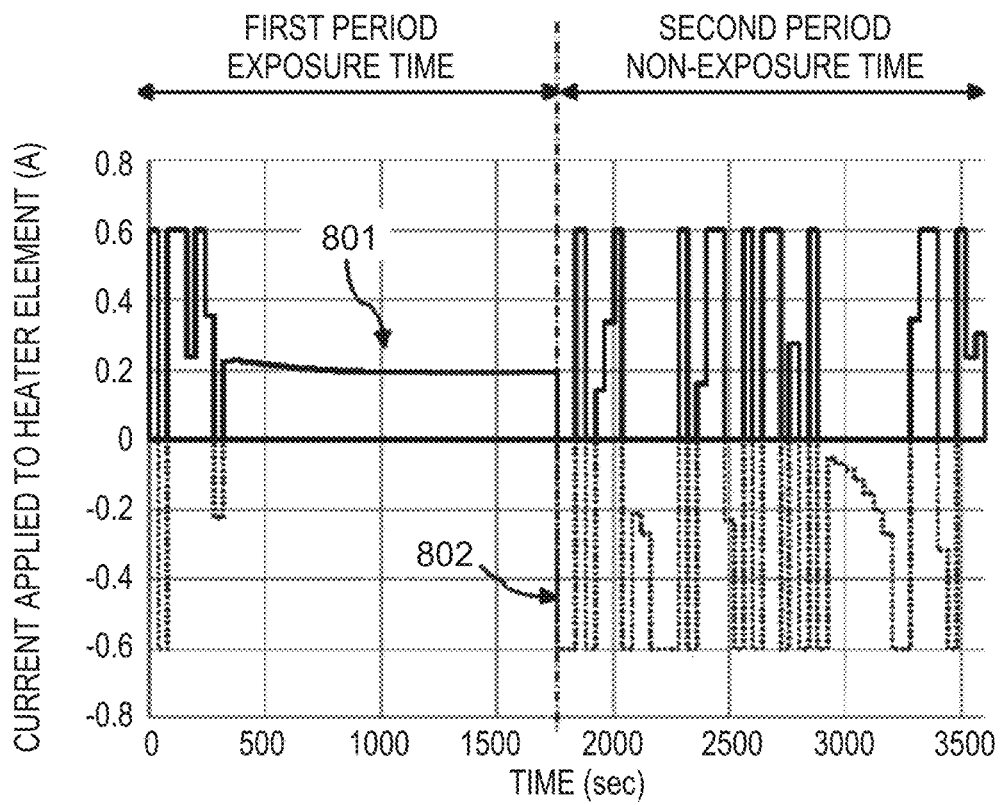
FIGS. 8A and 8B are graphs showing the correction of an aberration in a projection optical system of an exposure apparatus according to the second embodiment.
Figure 8B:
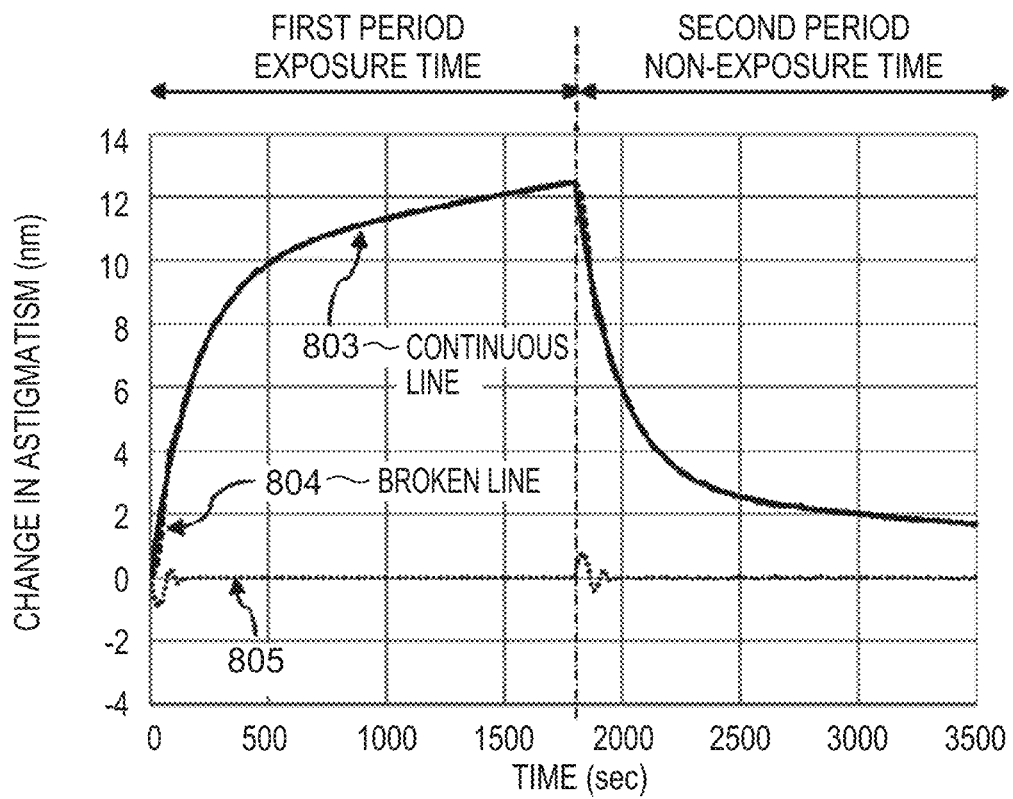

In the second embodiment, the first temperature controller 204 and the second temperature controller 203 can operate to reduce the change in the optical characteristic of a projection optical system 107 in the first period. Additionally, in the second embodiment, the first temperature controller 204 and the second temperature controller 203 can also operate to reduce the change in the optical characteristic of a projection optical system 107 in the second period. FIGS. 8A and 8B exemplify the operation of the first temperature controller 204 and the second temperature controller 203 according to the second embodiment. A current value 801 to be applied to the heater elements 204a and 204b of the first temperature controller 204 and a current value 802 obtained by multiplying a current to be applied to the heater elements 203a and 203b of the second temperature controller 203 by −1 are exemplified in FIG. 8A. Note that although the current 802 has been obtained by multiplying the current to be applied to the heater elements 203a and 203b of the second temperature controller 203 by −1, this is merely for the sake of visual convenience. The change in astigmatism 803 generated by the absorption of the light beam is exemplified in FIG. 8B. In addition, the change in astigmatism 804 obtained by multiplying the astigmatism generated by heating due to the current values applied to the heater element 204a and 204b of the first temperature controller 204 and the heater elements 203a and 203b of the second temperature controller 203 by −1 is exemplified in FIG. 8B. Furthermore, the change in a correction residual error 805 is exemplified in FIG. 8B. It can be seen that the astigmatism is reduced with high accuracy by operating the first temperature controller 204 and the second temperature controller 203 in both of the first period and the second period.

Figure 10:
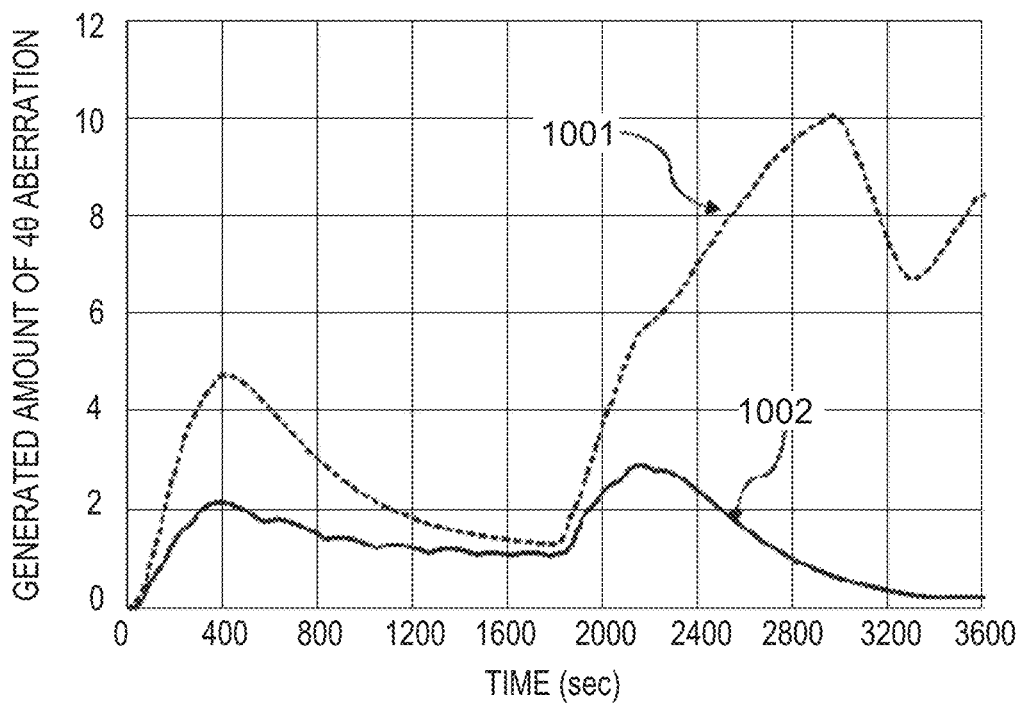
FIG. 10 is a graph exemplifying an aberration component other than astigmatism in the exposure apparatus according to the third embodiment.

The third embodiment will be described hereinafter with reference to FIGS. 9A and 9B and FIG. 10. Matters not mentioned in the third embodiment can follow those of the first and second embodiments. In the second embodiment, at least one of a first temperature controller 204 and a second temperature controller 203 can be operated in almost the entire period including the first and second periods to heat a lens 201. The heating of the lens 201 can generate a plurality of aberration components other than astigmatism. Although it is possible to predict the generation of a higher-order component among the plurality of components, it is difficult to correct such a component. In particular, unlike aberration components, such as astigmatisms, in which the aberrations that can be generated by the first temperature controller 204 and the second temperature controller 203 have opposite signs, it is difficult to reduce aberration components in which the aberrations that can be generated by the first temperature controller 204 and the second temperature controller 203 have the same sign. Hence, although the plurality of aberration components as described above will be generated as long as the lens 201 is heated, it is difficult to correct these aberration components.

Therefore, in the third embodiment, a controller 100 will operate the first temperature controller 204 and the second temperature controller 203 so an aberration (astigmatism) does not exceed a predetermined value while allowing the aberration to change within a predetermined range in the first period and the second period. As a result, the generation of an aberration that is difficult to correct by the heating of the lens 201 can be suppressed.

FIGS. 9A and 9B exemplify the operation of the first temperature controller 204 and the second temperature controller 203 according to the third embodiment. A current 901 to be applied to heater elements 204a and 204b of the first temperature controller 204 and a current 902 to be applied to heater elements 203a and 203b of the second temperature controller 203 are exemplified in FIG. 9A. The change in astigmatism 903 generated by the absorption of a light beam is exemplified in FIG. 9B. In addition, the change in the change in astigmatism 904 obtained by multiplying the astigmatism generated by heating due to the current values applied to the heater element 204a and 204b of the first temperature controller 204 and the heater elements 203a and 203b of the second temperature controller 203 by −1 is exemplified in FIG. 9B. Furthermore, the change in a correction residual error 905 is exemplified in FIG. 9B. In the third embodiment, the controller 100 operates the temperature adjustment unit 108 in a case in which the correction residual error 905 will exceed a range set by an upper limit 906a and a lower limit 906b so as to prevent the correction residual error 905 from falling outside a predetermined range 907. As a result, the astigmatism can be contained within the predetermined range 907 while suppressing the generation of other aberration components due to heating of the lens 201.

In this case, the aberration of the term Z17 of Zernike polynomials can be raised as one of aberration components which is other than astigmatism generated by the heating of the lens 201 and is difficult to correct. A Zernike term Z17 1001 that is generated by heating of the lens 201 in the second embodiment and a generated amount 1002 of the Zernike term Z17 that is generated by the heating of the lens 201 in the third embodiment are exemplified in FIG. 10. In the third embodiment, the generated amount of the Zernike term Z17 generated by the heating of the lens 201 is reduced to ⅓ of that in the second embodiment. In this manner, in the third embodiment, the heating of the lens 201 by the temperature adjustment unit 108 is reduced by allowing a correction residual error of astigmatism that falls within a predetermined range. As a result, the generation of an aberration component that is difficult to correct can be suppressed. Note that this method is a method of determining a trade-off between the correction accuracy of astigmatism and the generation of an aberration component other than astigmatism. Hence, the predetermined range in which the astigmatism is allowed can be determined by considering the balance between the influence of correction accuracy on the imaging performance and the influence of an aberration component other than astigmatism on the imaging performance. In addition, although the third embodiment has described the Zernike term Z17 as an aberration component that is difficult to correct, the present invention is not limited to this. For example, other higher-order 0θ components such as the Zernike term Z16 and the like may be considered, and lower-order 0θ components which are easy to correct may also be considered.

Figure 11:
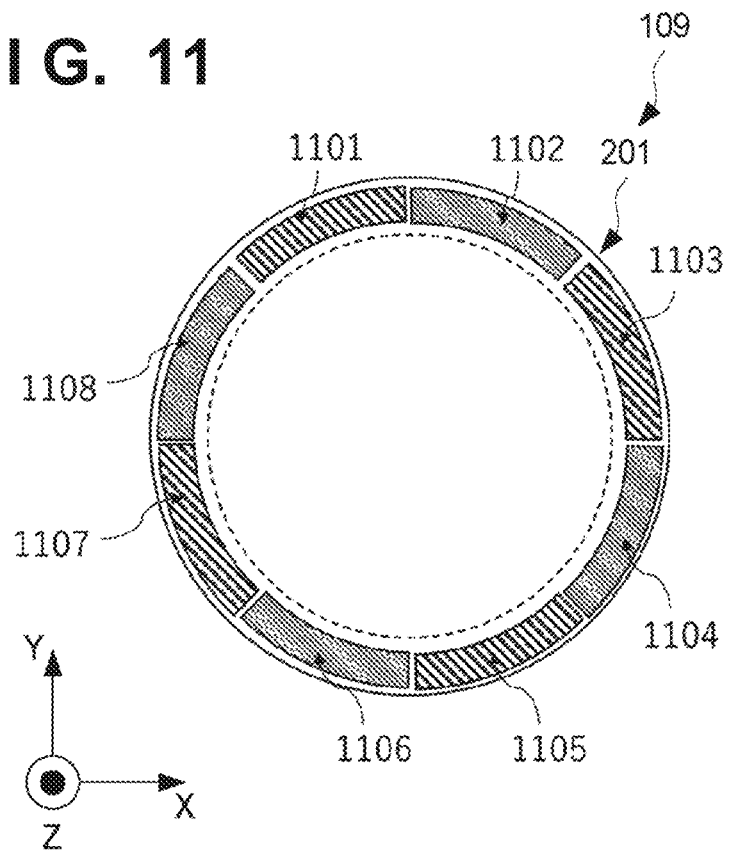
FIG. 11 is a view exemplifying the arrangement and layout of a heater element according to the fourth embodiment.

In the first to third embodiments, the temperature adjustment unit 108 is formed by heater elements, each having a length corresponding to ¼ of the circumference of the lens 201, and negative and positive astigmatisms are generated. However, this is merely an example, and the shape and the number of the heater elements can be selected in accordance with the aberration component to be corrected. FIG. 11 shows an example in which the temperature adjustment unit 108 is formed by eight heater elements 1101 to 1108, each having a length corresponding to ⅛ of the circumference of the lens. The first temperature controller can be formed by the heater elements 1102, 1104, 1106, and 1108, and the second temperature controller can be formed by the heater elements 1101, 1103, 1105, and 1107. As a result, since 40 aberration components can be generated in the positive and negative directions, the 40 aberration components can be corrected by the methods according to the first to third embodiments. Furthermore, it is possible to correct 30 aberration components by the same methods by arranging six heater elements, each corresponding to ⅙ of a length in the circumference direction, and it is also possible to correct 50 aberration components by arranging ten heater elements, each corresponding to ¹⁄₁₀ of the length in the circumference direction. That is, the number and the layout of the heater elements can be selected in accordance with the aberration component to be corrected. As a result, it will be possible to reduce, for example, at least one of the Nθ components (N is a natural number) of the Zernike polynomials.

An article manufacturing method of manufacturing an article (a semiconductor IC element, a liquid crystal display element, a MEMS, or the like) by using an exposure apparatus represented by the first to fourth embodiments described above will be described next. The article manufacturing method can include a step of exposing a substrate by the exposure apparatus described above, a step of developing the substrate exposed in the exposing, and a step of processing the substrate developed in the step of developing, and an article can be manufactured from the substrate processed in the step of processing. The processing can include, for example, etching, resist removal, dicing, bonding, packaging, and the like. An article of a higher quality than that of a related art can be manufactured according to this article manufacturing method.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefits of Japanese Patent Application No. 2019-117714 filed Jun. 25, 2019 and Japanese Patent Application No. 2020-068731 filed Apr. 7, 2020, which are hereby incorporated by reference herein in their entirety.

What is claimed is:

1. An exposure apparatus that performs an exposure operation to expose a substrate via a projection optical system, the exposure apparatus comprising:
a temperature adjuster, including a first temperature controller and a second temperature controller arranged at positions different from each other, configured to control a temperature distribution on an optical element of the projection optical system, wherein the temperature adjuster controls the first temperature controller to control heating of a first region of the optical element and controls the second temperature controller to control heating of a second region of the optical element, the second region being different from the first region, so that:
during a first period in which the exposure operation is performed, the optical element has a first non-uniform temperature distribution to reduce a change in an aberration of the projection optical system due to the exposure operation being performed; and
during a second period, which follows the first period, in which the exposure operation is not performed, the optical element has a second non-uniform temperature distribution to reduce a change in the aberration of the projection optical system due to the exposure operation being not performed.

2. The apparatus according to claim 1, wherein:
the first temperature controller applies a first temperature distribution to the optical element in the first period and the second temperature controller applies a second temperature distribution to the optical element in the second period, and
the first temperature distribution and the second temperature distribution have opposite phases.

3. The apparatus according to claim 1, wherein the first and second temperature controllers are arranged outside an effective diameter of the optical element.

4. The apparatus according to claim 1, wherein the temperature adjuster is configured to reduce at least one NO component, where N is a natural number, of Zernike polynomials as the aberration.

5. The apparatus according to claim 1, wherein the temperature adjuster is configured to reduce astigmatism as the aberration.

6. The apparatus according to claim 1, wherein the first period is from a start of a first exposure operation on a substrate to an end of a final exposure operation on the substrate.

7. The apparatus according to claim 6, wherein the second period starts from the end of the final exposure operation on the substrate.

8. The apparatus according to claim 1, wherein the first period is from a start of a first exposure operation on a first substrate of a first lot to an end of a final exposure operation on a final substrate of the first lot.

9. The apparatus according to claim 8, wherein the second period is from the end of the final exposure operation on the final substrate of the first lot to the start of the first exposure operation on the first substrate of a second lot following the first lot.

10. The apparatus according to claim 1, wherein the first period is from a start of an exposure operation on one shot region of a substrate to an end of the exposure operation on the one shot region of the substrate.

11. The apparatus according to claim 10, wherein the second period is from the end of the exposure operation on the one shot region of the substrate to a start of the exposure operation on a next shot region of the substrate.

12. The apparatus according to claim 1, wherein:
the first temperature controller operates so as to reduce the change in the aberration of the projection optical system in the first period, and
the second temperature controller operates so as to reduce the change in the aberration of the projection optical system in the second period.

13. The apparatus according to claim 1, wherein:
the first temperature controller and the second temperature controller operate so as to reduce the change in the aberration of the projection optical system in the first period, and
the first temperature controller and the second temperature controller operate so as to reduce the change in the aberration of the projection optical system in the second period.

14. The apparatus according to claim 13, wherein, in the first and second periods, the first and second temperature controllers operate so that the aberration does not fall outside a predetermined range while allowing the aberration to change within the predetermined range.

15. A method of manufacturing an article, the method comprising:
exposing a substrate with the exposure apparatus according to claim 1;
developing the substrate exposed in the exposing; and
processing the substrate developed in the developing to obtain the article.

16. An exposure method of performing an exposure operation to expose a substrate via a projection optical system including a temperature adjuster, including a first temperature controller and a second temperature controller arranged at positions different from each other, configured to control a temperature distribution on an optical element of the projection optical system, the method comprising:
controlling the temperature adjuster during a first period in which the exposure operation is performed, so that the optical element has a first non-uniform temperature distribution to reduce change in the aberration of the projection optical system due to the exposure operation being performed; and
controlling the temperature adjuster during a second period, which follows the first period, in which the exposure operation is not performed, so that the optical element has a second non-uniform temperature distribution to reduce a change in the aberration of the projection optical system due to the exposure operation being not performed,
wherein the optical element has the first non-uniform temperature distribution and the second non-uniform temperature distribution by controlling the first temperature controller to control heating of a first region of the optical element and controls the second temperature controller to control heating of a second region of the optical element, the second region being different from the first region.

17. The method according to claim 16, wherein:
in the controlling in the first period, the first temperature controller to applies a first temperature distribution to the optical element,
in the controlling in the second period, the second temperature controller applies a second temperature distribution to the optical element, and
the first temperature distribution and the second temperature distribution have opposite phases.

18. The method according to claim 16, wherein:
the controlling in the first period controls the first temperature controller in accordance with a first command value corresponding to an elapsed time from a start of the first period, and
the controlling in the second period controls the second temperature controller in accordance with a second command value corresponding to an elapsed time from a start of the second period.

19. The method according to claim 16, wherein the first and second temperature controllers are arranged outside an effective diameter of the optical element.

20. The method according to claim 16, wherein the temperature adjuster is configured to reduce at least one $N\theta$ component, where N is a natural number, of Zernike polynomials as the aberration.

21. The method according to claim 16, wherein the temperature adjuster is configured to reduce astigmatism as the aberration.

22. The method according to claim 16, wherein the first period is from a start of a first exposure operation on a substrate to an end of a final exposure operation on the substrate.

23. The method according to claim 22, wherein the second period starts from the end of the final exposure operation on the substrate.

24. The method according to claim 16, wherein the first period is from a start of a first exposure operation on a first substrate of a first lot to an end of a final exposure operation on a final substrate of the first lot.

25. The method according to claim 24, the second period is from the end of the final exposure operation on the final substrate of the first lot to the start of the first exposure operation on the first substrate of a second lot following the first lot.

26. The method according to claim 16, the second period is from the end of the final exposure operation on the final substrate of the first lot to the start of the first exposure operation on the first substrate of a second lot following the first lot.

27. The method according to claim 26, the second period is from the end of the exposure operation on the one shot region of the substrate to a start of the exposure operation on a next shot region of the substrate.

28. The method according to claim 16, wherein:
the controlling in the first period controls the first temperature controller to reduce the change in the aberration of the projection optical system in the first period, and
the controlling in the second period controls the second temperature controller to reduce the change in the aberration of the projection optical system in the second period.

29. The method according to claim 16, wherein:
the controlling in the first period controls the first and second temperature controllers to reduce the change in the aberration of the projection optical system in the first period, and
the controlling in the second period controls the first and second temperature controllers to reduce the change in the aberration of the projection optical system in the second period.

30. The method according to claim 29, wherein, the controlling in the first and second periods controls the first and second temperature controllers so that the aberration does not fall outside a predetermined range while allowing the aberration to change within the predetermined range.

31. A method of manufacturing an article, the method comprising:
exposing a substrate with exposure method according to claim 16;
developing the substrate exposed in the exposing; and
processing the substrate developed in the developing to obtain the article.

32. A method of manufacturing an article, the method comprising:
- exposing a substrate via an optical projection system including a temperature adjuster, including a first temperature controller and a second temperature controller arranged at positions different from each other, configured to control a temperature distribution on an optical element of the projection optical system;
- obtaining the article from the exposed substrate;
- controlling the temperature adjuster, during a first period in which the exposing of the substrate is performed, so that the optical element has a first non-uniform temperature distribution to reduce change in the aberration of the projection optical system due to the exposure operation being executed; and
- controlling the temperature adjuster, during a second period, which follows the first period, in which the exposure operation is not performed, so that the optical element has a second non-uniform temperature distribution to reduce a change in the aberration of the projection optical system due to the exposure operation not being performed,
- wherein the optical element has the first non-uniform temperature distribution and the second non-uniform temperature distribution by controlling the first temperature controller to control heating of a first region of the optical element and controls the second temperature controller to control heating of a second region of the optical element, the second region being different from the first region.

* * * * *